(12) United States Patent
Singh et al.

(10) Patent No.: US 12,362,203 B2
(45) Date of Patent: Jul. 15, 2025

(54) METHOD FOR ETCHING ETCH LAYER

(71) Applicant: TAIWAN SEMICONDUCTOR MANUFACTURING CO., LTD., Hsinchu (TW)

(72) Inventors: Manish Kumar Singh, Hsinchu (TW); Bo-Wei Chou, Hsinchu (TW); Jui-Ming Shih, Hsinchu (TW); Wen-Yu Ku, Hsinchu (TW); Ping-Jung Huang, Yunlin County (TW); Pi-Chun Yu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/361,555

(22) Filed: Jul. 28, 2023

(65) Prior Publication Data

US 2023/0377912 A1    Nov. 23, 2023

Related U.S. Application Data

(62) Division of application No. 16/404,533, filed on May 6, 2019, now Pat. No. 11,784,065, which is a division of application No. 14/696,973, filed on Apr. 27, 2015, now Pat. No. 10,283,384.

(51) Int. Cl.
*H01L 21/67* (2006.01)
*H01L 21/311* (2006.01)

(52) U.S. Cl.
CPC .... *H01L 21/6708* (2013.01); *H01L 21/67086* (2013.01); *H01L 21/67109* (2013.01); *H01L 21/67248* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 5,779,796 A | 7/1998 | Tomoeda et al. | |
| 5,906,860 A | 5/1999 | Motoda et al. | |
| 6,805,769 B2 | 10/2004 | Okuda et al. | |
| 7,959,820 B2 * | 6/2011 | Hashizume | H01L 21/6708 216/88 |
| 8,043,469 B2 | 10/2011 | Nakamori et al. | |
| 8,062,471 B2 | 11/2011 | Mikhaylichenko et al. | |
| 8,172,641 B2 | 5/2012 | Ho et al. | |
| 8,328,942 B2 | 12/2012 | Mooring et al. | |
| 8,398,817 B2 | 3/2013 | Namba et al. | |

(Continued)

FOREIGN PATENT DOCUMENTS

| | | |
|---|---|---|
| CN | 101151708 A | 3/2008 |
| CN | 100505170 C | 6/2009 |

(Continued)

OTHER PUBLICATIONS

CN Office Action dated Dec. 29, 2023 as received in Application No. 202110710959.4.

*Primary Examiner* — Sylvia MacArthur
(74) *Attorney, Agent, or Firm* — Maschoff Brennan

(57) ABSTRACT

A method includes rotating a wafer, dispensing a liquid from a center of the wafer to a peripheral edge of the wafer to control a temperature of the wafer, and etching an etch layer of the wafer with an etchant during or after dispensing the liquid. The liquid is dispensed through a nozzle.

20 Claims, 11 Drawing Sheets

(56) References Cited

U.S. PATENT DOCUMENTS

| | | | |
|---|---|---|---|
| 8,815,111 B2* | 8/2014 | Nakamura | H01L 21/67051 134/32 |
| 9,460,944 B2 | 10/2016 | Fujiwara et al. | |
| 9,786,527 B2* | 10/2017 | Shibayama | H01L 21/30604 |
| 2004/0088880 A1 | 5/2004 | Yang | |
| 2004/0222191 A1 | 11/2004 | Kim et al. | |
| 2005/0221621 A1 | 10/2005 | Mikhaylichenko et al. | |
| 2007/0114208 A1 | 5/2007 | Takahashi | |
| 2009/0004876 A1 | 1/2009 | Koyata et al. | |
| 2009/0117706 A1 | 5/2009 | Soeta et al. | |
| 2009/0194509 A1 | 8/2009 | Nada et al. | |
| 2010/0181290 A1 | 7/2010 | Namba et al. | |
| 2011/0143550 A1 | 6/2011 | Saito | |
| 2011/0240067 A1 | 10/2011 | Kishimoto et al. | |
| 2012/0074102 A1* | 3/2012 | Magara | H01L 21/6708 156/345.23 |
| 2012/0238040 A1 | 9/2012 | Kubota et al. | |
| 2013/0319476 A1* | 12/2013 | Aiura | H01L 21/67115 134/33 |
| 2014/0051259 A1 | 2/2014 | Shibayama | |
| 2014/0090669 A1 | 4/2014 | Hinode et al. | |
| 2014/0148006 A1 | 5/2014 | Tanaka et al. | |
| 2014/0209129 A1 | 7/2014 | Okorn-Schmidt et al. | |
| 2014/0311675 A1 | 10/2014 | Yi et al. | |
| 2015/0031214 A1 | 1/2015 | Basset et al. | |
| 2015/0060406 A1* | 3/2015 | Negoro | B05D 1/36 118/706 |
| 2015/0072078 A1 | 3/2015 | Negoro et al. | |
| 2015/0093906 A1 | 4/2015 | Kobayashi et al. | |
| 2015/0162224 A1 | 6/2015 | Hinode et al. | |
| 2016/0169563 A1 | 6/2016 | Han et al. | |
| 2016/0314994 A1 | 10/2016 | Singh et al. | |
| 2017/0170032 A1 | 6/2017 | Shibayama | |
| 2023/0377912 A1* | 11/2023 | Singh | H01L 21/67248 |

FOREIGN PATENT DOCUMENTS

| | | |
|---|---|---|
| CN | 102683247 A | 9/2012 |
| CN | 102779724 A | 11/2012 |
| CN | 103999197 A | 8/2014 |
| JP | 2000-114152 A | 4/2000 |
| JP | 2005-191163 A | 7/2005 |
| JP | 6120203 B2 | 4/2017 |
| KR | 20060045033 A | 5/2006 |
| KR | 20100086444 A | 7/2010 |
| KR | 10-2014-0024211 A | 2/2014 |
| TW | 201411715 A | 3/2014 |
| WO | 2014069079 A1 | 5/2014 |

* cited by examiner

METHOD FOR ETCHING ETCH LAYER

CROSS-REFERENCE TO RELATED APPLICATION

This application is a divisional of U.S. patent application Ser. No. 16/404,533, filed May 6, 2019, which is a divisional of U.S. patent application Ser. No. 14/696,973, filed Apr. 27, 2015, issued as U.S. patent Ser. No. 10/283,384 on May 7, 2019, which is herein incorporated by reference in its entirety.

BACKGROUND

Etching is used in microfabrication to chemically remove layers from the surface of a wafer during manufacturing. Etching is a process module, and every wafer undergoes many etching steps before it is complete. For many etch steps, part of the wafer is protected from the etchant by a "masking" material which resists etching. In some cases, the masking material is a photoresist which has been patterned using photolithography. Other situations require a more durable mask, such as silicon nitride.

The wafer can be immersed in a bath of etchant, which must be agitated to achieve good process control. For instance, buffered hydrofluoric acid (BHF) is used commonly to etch silicon dioxide over a silicon substrate. Different specialized etchants can be used to characterize the surface etched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
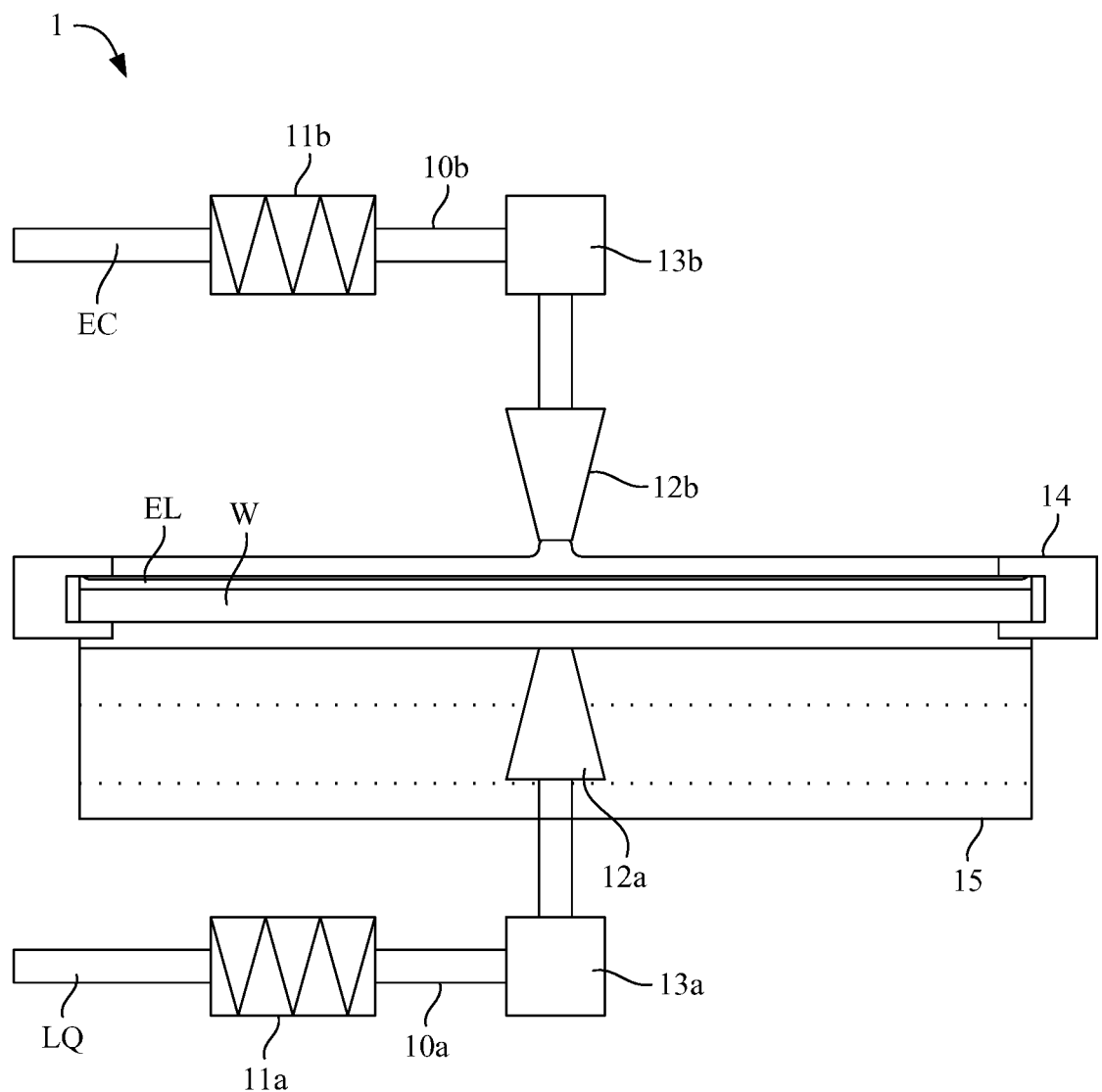
FIG. 1 is a partial view of a wafer etching apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Layers (e.g., poly-Si/SiO2) might be etched at moderately high temperature (e.g. 60° C.) or at room temperature (e.g., 25° C.). However, etch layer removal requires high temperature reactants (e.g., 200° C.) to effectively remove silicon nitride layer. While etchants are heated for this, it is consistently observed that the temperature fluctuation across a wafer that is at room temperature is severe. That is, the situation adversely affects process control and etching uniformity for the etching process. To solve the problem, the disclosure is proposed to preheat the wafer before dispensing the heated etchants, so at to well regulate and control temperature, to rapidly ramp temperature, and to get better uniformity across the wafer.

FIG. 1 is a partial view of a wafer etching apparatus 1 according to some embodiments of the present disclosure.

As shown in FIG. 1, the wafer etching apparatus 1 is a single wafer tool. The wafer etching apparatus 1 may be contained within a hermetic chamber (not shown). The hermetic chamber may avoid contamination and maintain environmental stability within the wafer etching apparatus 1. The wafer etching apparatus 1 is configured to perform an etching process, specifically a wet etching process, on a wafer W. In the depicted embodiments, an etch layer is formed on a front side of the wafer W (i.e., the upper side of the wafer W in FIG. 1), and the wafer etching apparatus 1 is configured to etch the etch layer. In some embodiments, the etch layer EL is a silicon nitride layer, but the disclosure is not limited in this regard. The wafer etching apparatus 1 may completely etch the etch layer EL or remove portions of the etch layer EL, such that a patterned etch layer EL remains after the etching process.

As shown in FIG. 1, the wafer etching apparatus 1 includes a first flow channel 10a, a second flow channel 10b, a temperature-regulating module 11a, a heater 11b, a first nozzle 12a, a second nozzle 12b, a first mass flow controller 13a, a second mass flow controller 13b, a chuck 14, and a base 15. The chuck 14 is configured to hold the wafer W. The first flow channel 10a is configured to carry a liquid LQ for controlling a temperature of a back side of the wafer W. The temperature-regulating module 11a is coupled to the first flow channel 10a. The temperature-regulating module 11a is configured to control a temperature of the liquid LQ in the first flow channel 10a. The first mass flow controller 13a is coupled to the first flow channel 10a. The first mass flow controller 13a is configured to measure and control the flow of the liquid LQ at a particular range of flow rates. The first nozzle 12a is coupled to the first flow channel 10a and located right under the back side of the wafer W. The first nozzle 12a is configured to dispense the liquid LQ to the back side of the wafer W (i.e., the lower side of the wafer W in FIG. 1). The base 15 is located at the back side of the wafer W and forms a gap with the back side of the wafer W.

The first nozzle 12a is fixed to the base 15. For example, the first nozzle 12a is embedded in the base 15, and the outlet of the first nozzle 12a is exposed to face the back side of the wafer W. The temperature-regulating module 11a in FIG. 1 is illustrated as a heater configured to heat the liquid LQ for example, but the disclosure is not limited in this regard. In some embodiments, the temperature-regulating module 11a is a cooler configured to cool the liquid LQ.

The second flow channel 10b is configured to carry an etchant EC for etching the etch layer EL formed on the front side of the wafer W. The heater 11b is coupled to the second flow channel 10b. The heater 11b is configured to heat the etchant EC in the second flow channel 10b. The second mass flow controller 13b is coupled to the second flow channel 10b. The second mass flow controller 13b is configured to measure and control the flow of the etchant EC at a particular range of flow rates. The second nozzle 12b is coupled to the second flow channel 10b and located right over a center of the front side of the wafer W. The second nozzle 12b is configured to dispense the heated etchant EC onto the front side of the wafer W.

Figure 2:
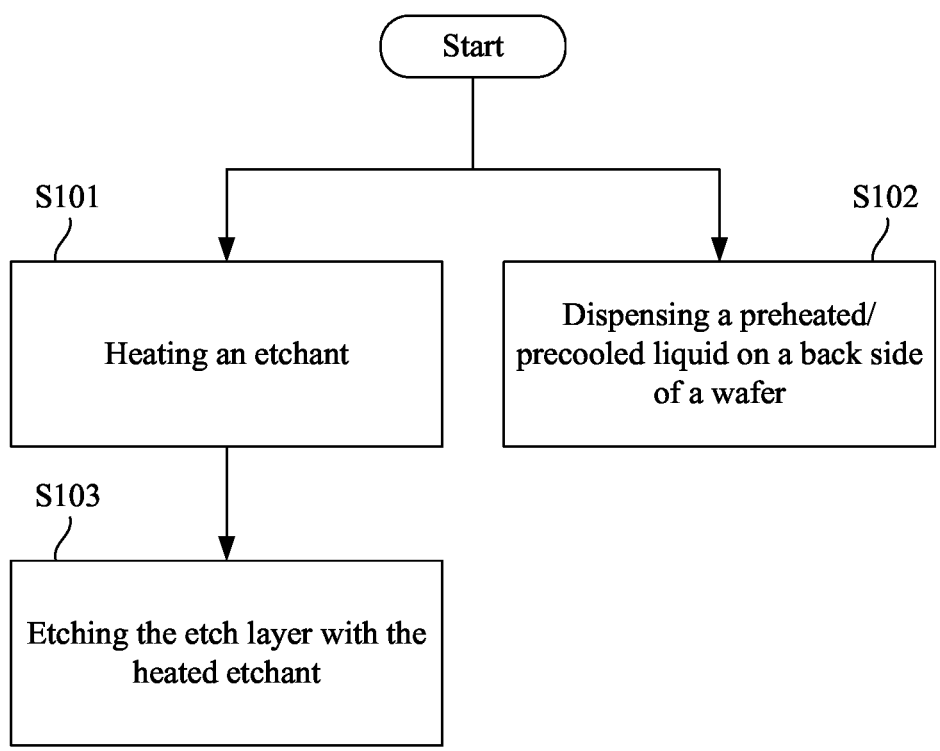
FIG. 2 is a flow chart of a method for etching an etch layer according to some embodiments of the present disclosure.

FIG. 2 is a flow chart of a method for etching an etch layer according to some embodiments of the present disclosure. As shown in FIG. 2, with reference to FIG. 1, the method for etching an etch layer at least includes steps S101-S103 shown below, and the steps can be performed by using the wafer etching apparatus 1 shown in FIG. 1.

In step S101, an etchant EC is heated. As shown in FIG. 1, the etchant EC can be heated by the heater 11b in the second flow channel 10b before dispensed onto the front side of the wafer W. In some embodiments, the wafer etching apparatus 1 can further includes a temperature controller (not shown) and a temperature sensor (not shown). The temperature sensor is coupled to the second flow channel 10b and configured to sense the actual temperature of the heated etchant EC. The temperature controller is configured to adjust the actual temperature to a predetermined temperature by controlling the heater 11b. Alternatively, in some embodiments, the temperature of the etchant EC is equal to the room temperature before etching the etch layer EL of the wafer W, that is, step S101 can be omitted.

Thereafter in step S102, a preheated/precooled liquid LQ is dispensed on a back side of a wafer W. In other words, in step S102, the liquid LQ is applied to the back side of the wafer W, and a temperature of the liquid LQ can be greater than, smaller than, or equal to a temperature of the wafer. As shown in FIG. 1, the temperature of the liquid LQ can be controlled by the temperature-regulating module 11a in the first flow channel 10a before dispensed to the back side of the wafer W, and the first mass flow controller 13a can control the flow rate of the liquid LQ dispensed out of the first nozzle 12a. After dispensed out of the first nozzle 12a, the liquid LQ flows along the gap formed between the base 15 and the back side of the wafer W, so as to control the temperature of the whole back side of the wafer W. Likewise, in some embodiments, the wafer etching apparatus 1 can further includes a temperature controller (not shown) and a temperature sensor (not shown). The temperature sensor is coupled to the first flow channel 10a and configured to sense the actual temperature of the liquid LQ. The temperature controller is configured to adjust the actual temperature to a predetermined temperature by controlling the temperature-regulating module 11a.

Thereafter in step S103, the etch layer EL is etched with the heated etchant EC. As shown in FIG. 1, the second mass flow controller 13b can control the flow rate of the heated etchant EC dispensed out of the second nozzle 12b. In some embodiments, the chuck 14 is capable of rotating the wafer W in a plane, and the heated etchant EC is dispensed at the center of the front side of the wafer W. Therefore, the dispensed etchant EC can thus be uniformly distributed from the center to a peripheral edge of the front side of the wafer W to etch the etch layer EL.

As shown in FIG. 2, steps S103 is performed during step S102, that is, etching the etch layer EL with the heated etchant EC is performed during dispensing the liquid LQ on the back side of the wafer W. In some embodiments, step S102 can be continuously performed to control the temperature of the back side of the wafer W and to make the dispensed liquid LQ form a steady flow at the gap between the base 15 and the back side of the wafer W, and step S103 is then performed to etch the etch layer EL on the front side of the wafer W.

In some embodiments, the etchant EC is phosphoric acid, and the liquid LQ is different from the etchant EC, but the disclosure is not limited in this regard. For example, the liquid LQ is water, but the disclosure is not limited in this regard.

With the foregoing configuration, it can be seen that the temperature of the wafer W is controlled during or before dispensing the heated etchant EC. As a result, the method for etching an etch layer and the wafer etching apparatus 1 of the disclosure can well regulate and control temperature (by reducing temperature variation between the dispensed etchant EC and the heated/cooled wafer W), rapidly ramp temperature, and get better uniformity across the wafer W. In some embodiment, to further reduce the temperature fluctuation across the wafer W, a difference between the temperature of the liquid LQ and a temperature of the heated etchant EC is smaller than a difference between the temperature of the liquid LQ and the temperature of the wafer W before the wafer W is heated/cooled and etched.

In addition, with the shrinking feature size the etch margins for substrates are getting ever smaller. This is especially relevant for the next generation 450 mm wafers where the large wafer size would bring in-wafer uniformity challenges. Presently, this is mitigated by using very low ER (etching rate)—through chemicals with ultralow dilution (1:1000, 1:1:50, etc). Challenges will exist for even these very low concentrations at larger wafer diameter. Traditionally, if the etching amount has to be adjusted, process time, chemical temperature, and chemical concentration have to be changed.

Figure 3A:
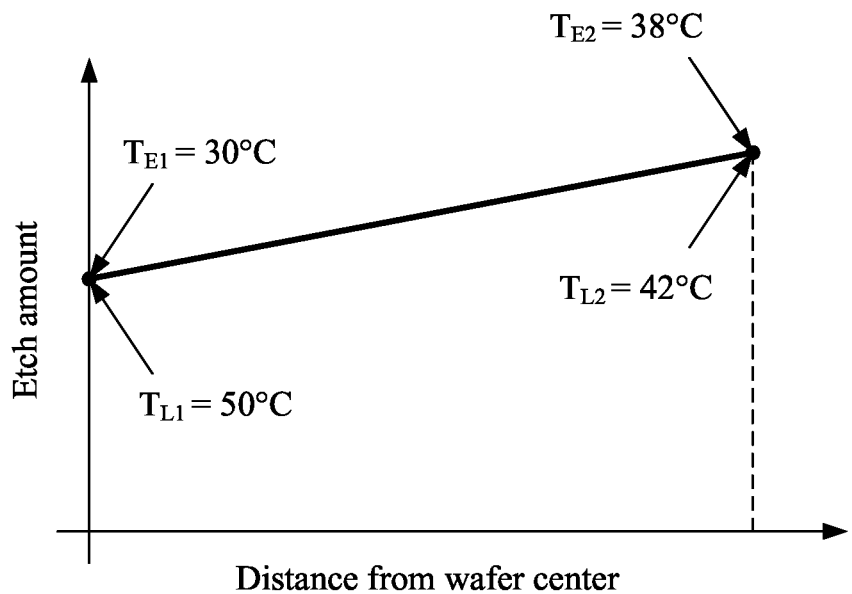
FIG. 3A is a diagram of etch profile of the etch layer on the front side of the wafer under a process configuration, in which the X-Axis is distance from wafer center and Y-Axis is the etch Amount.
Figure 3B:
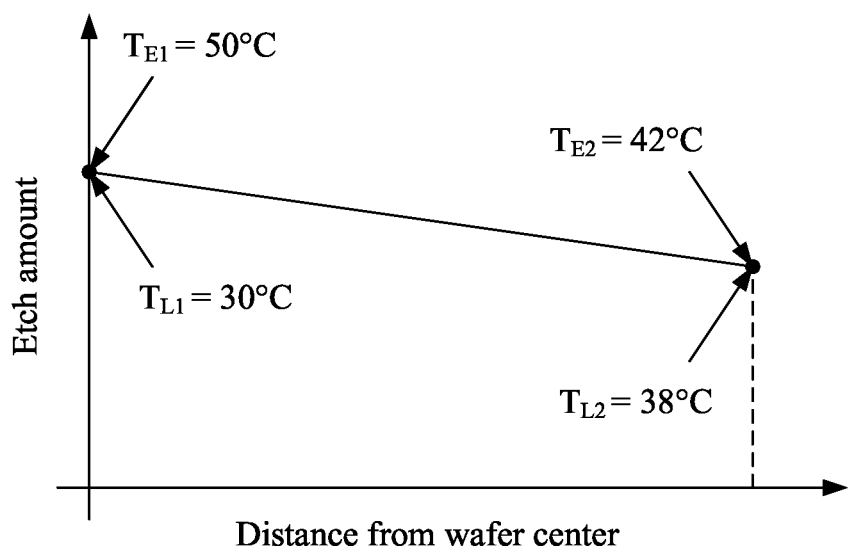
FIG. 3B is another diagram of etch profile of the etch layer on the front side of the wafer under another process configuration.

However, with the foregoing configuration of the present disclosure, trends of the etch profile of the etch layer EL on the front side of the wafer W can be effectively controlled, and the trends are observed and obtained experimentally and illustrated in FIG. 3A and FIG. 3B. FIG. 3A is a diagram of etch profile of the etch layer EL on the front side of the wafer W under a process configuration, in which the X-Axis is distance from wafer W center and Y-Axis is the etch Amount. FIG. 3B is another diagram of etch profile of the etch layer EL on the front side of the wafer W under another process configuration.

As shown in FIG. 3A, in the process configuration, the temperature TE1 of the dispensed etchant EC at the center of the front side of the wafer W is 30° C., and the temperature TL1 of the dispensed liquid LQ at the center of the back side of the wafer W is 50° C. that is larger than the temperature TEL After heat exchange via the wafer W, the temperature TE2 of the etchant EC at the peripheral edge of the front side of the wafer W is increased to 38° C., and the temperature TL2 of the liquid LQ at the peripheral edge of the back side of the wafer W is decreased to 42° C. It is noted that in the process configuration, the trend of the etch profile gradually rises from the center to the peripheral edge of the wafer W. That is, the slope of the process configuration (i.e., TE1<TL1) is positive.

In contrast, as shown in FIG. 3B, in the process configuration, the temperature TE1 of the dispensed etchant EC at the center of the front side of the wafer W is 50° C., and the temperature TL1 of the dispensed liquid LQ at the center of the back side of the wafer W is 30° C. that is smaller than the temperature TEL After heat exchange via the wafer W, the temperature TE2 of the etchant EC at the peripheral edge of the front side of the wafer W is decreased to 42° C., and the temperature TL2 of the liquid LQ at the peripheral edge of the back side of the wafer W is increased to 38° C. It is noted that in the process configuration, the trend of the etch profile gradually drops from the center to the peripheral edge of the wafer W. That is, the slope of the process configuration (i.e., TE1>TL1) is negative. It is noted that the temperature values illustrated above are just estimates, which are intended to show how the method of the present disclosure works.

In the above process configurations, the wafer W serves as the separator between two flows (i.e., the etchant EC and the liquid LQ) with different temperatures. This setup can be modeled as a co-current heat exchanger. LMTD (Logarithmic mean temperature difference) determines the effectiveness of heat transfer and final temperature at wafer edge. The LMTD is defined as:

$$LMTD = \frac{\Delta T_A - \Delta T_B}{\ln\left(\frac{\Delta T_A}{\Delta T_B}\right)}$$

where $\Delta T_A$ is the temperature difference between the two streams at end A (i.e., the temperature difference between TE1 and TL1), and $\Delta T_B$ is the temperature difference between the two streams at end B (i.e., the temperature difference between TE2 and TL2). In this setup that the heat exchange area increases as the square of radius, suggesting that the temp difference must fall very rapidly.

Therefore, according to the above process configurations, it can be seen that the trend of the etch profile of the wafer W can be effectively controlled as needed by adjusting the temperature TE1 of the dispensed etchant EC and the temperature TL1 of the dispensed liquid LQ. As a result, the method for etching an etch layer and the wafer etching apparatus 1 of the disclosure can well regulate and control temperature (by reducing temperature variation between the dispensed etchant EC and the heated/cooled wafer W) and get better uniformity across the wafer W.

Figure 4:
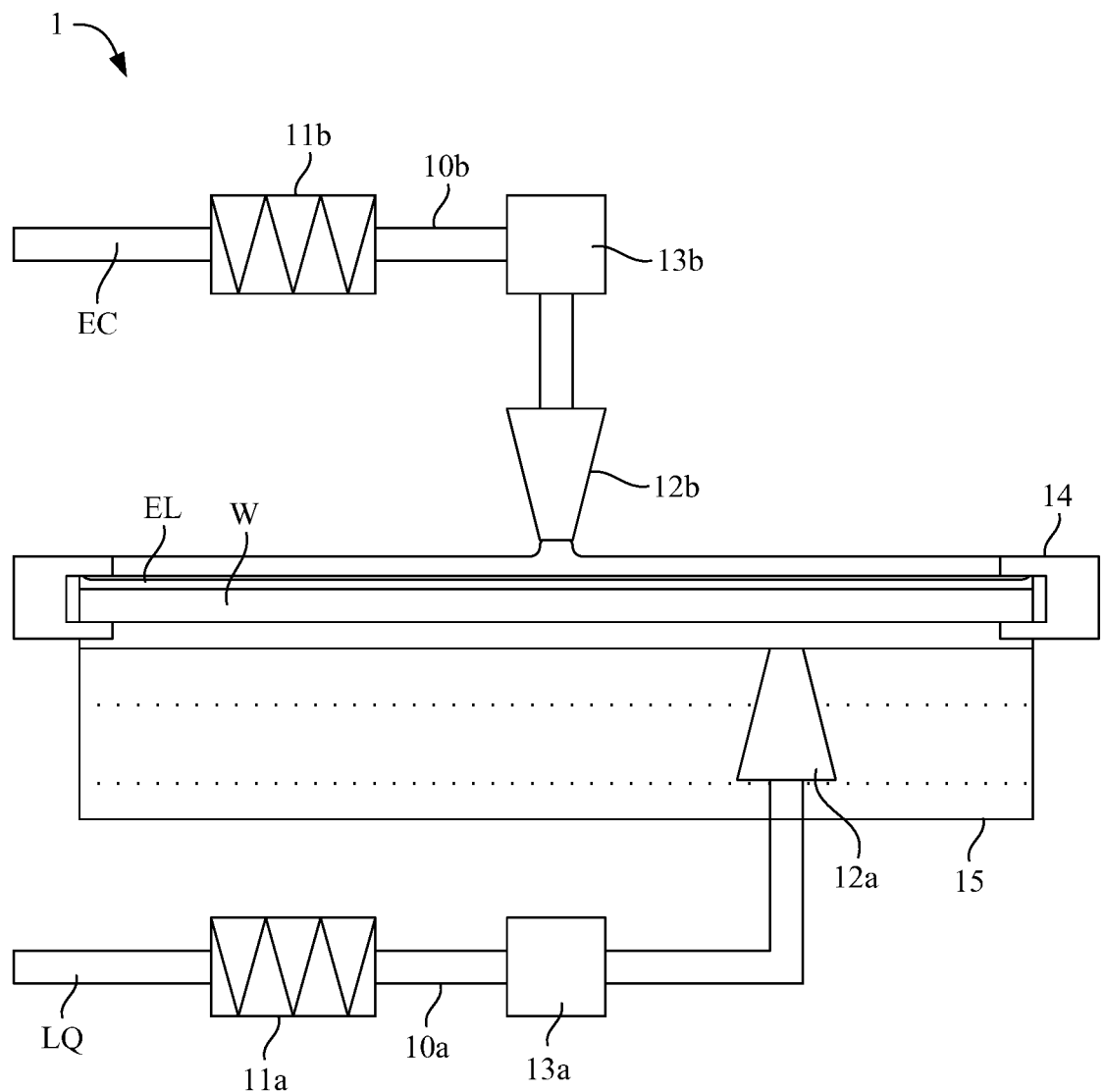
FIG. 4 is a partial view of a wafer etching apparatus according to some embodiments of the present disclosure.

In some embodiments, the temperature of the back side of the wafer W can be controlled through a program (recipe) which varies temperature as a function of time or by the position of the first nozzle 12a (or the position of the second nozzle 12b), as illustrated in FIG. 4. FIG. 4 is a partial view of a wafer etching apparatus 1 according to some embodiments of the present disclosure. As shown in FIG. 4, the wafer etching apparatus 1 also includes the first flow channel 10a, the second flow channel 10b, the temperature-regulating module 11a, the heater 11b, the first nozzle 12a, the second nozzle 12b, the first mass flow controller 13a, the second mass flow controller 13b, the chuck 14, and the base 15. Compared with some embodiment such as FIG. 1 shows, the first nozzle 12a shown in FIG. 4 is embedded in the base 15, and the outlet of the first nozzle 12a is exposed to face the back side of the wafer W and aligned with a location between the center and the peripheral edge of the back side of the wafer W. As a result, the liquid LQ is dispensed at the location between the center and the peripheral edge of the back side of the wafer W.

Figure 5:
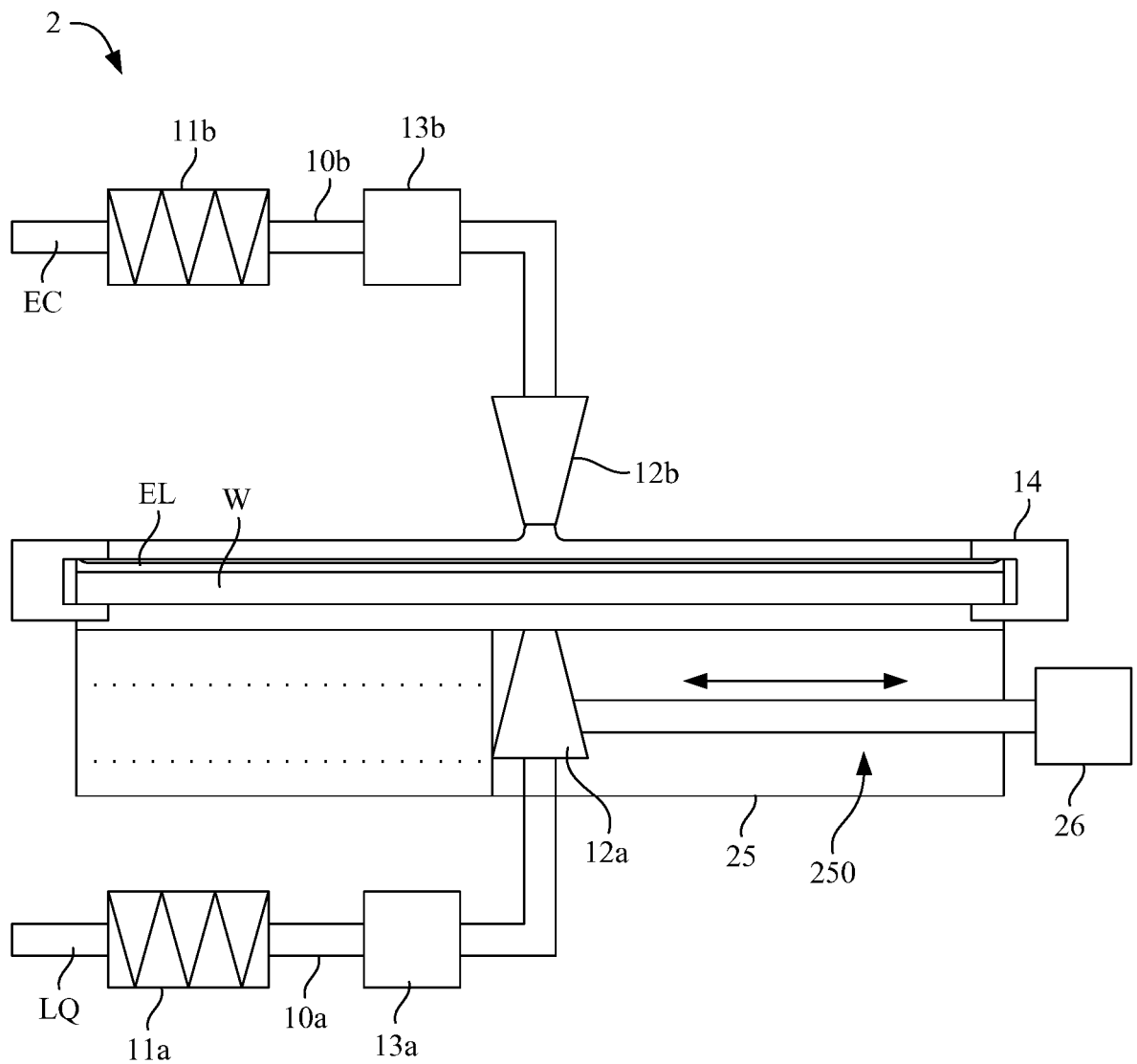
FIG. 5 is a partial view of a wafer etching apparatus according to some embodiments of the present disclosure.

In some embodiments, the backside nozzle may be fixed or may be scan capable. For example, FIG. 5 is a partial view of a wafer etching apparatus 2 according to some embodiments of the present disclosure. As shown in FIG. 5, the wafer etching apparatus 2 also includes the first flow channel 10a, the second flow channel 10b, the temperature-regulating module 11a, the heater 11b, the first nozzle 12a, the second nozzle 12b, the first mass flow controller 13a, the second mass flow controller 13b, and the chuck 14. Compared with some embodiments such as FIG. 1 and FIG. 2 show, the wafer etching apparatus 2 of shown in FIG. 5 further includes a nozzle actuator 26 and a modified base 25. The nozzle actuator 26 is connected to the first nozzle 12a. The nozzle actuator 26 is configured to move the first nozzle 12a along the back side of the wafer W along a pre-programmed path between a center and a peripheral edge of the back side of the wafer W. The base 25 has a passage 250 for allowing the movement of the first nozzle 12a. The liquid LQ dispensed from the first nozzle 12a flows along a gap formed between the base 25 and the back side of the wafer W.

In some embodiments, the wafer etching apparatus 1 may have a fixed first nozzle 12a and scan the wafer W using a movable stage (not shown) holding the wafer W.

Figure 6A:
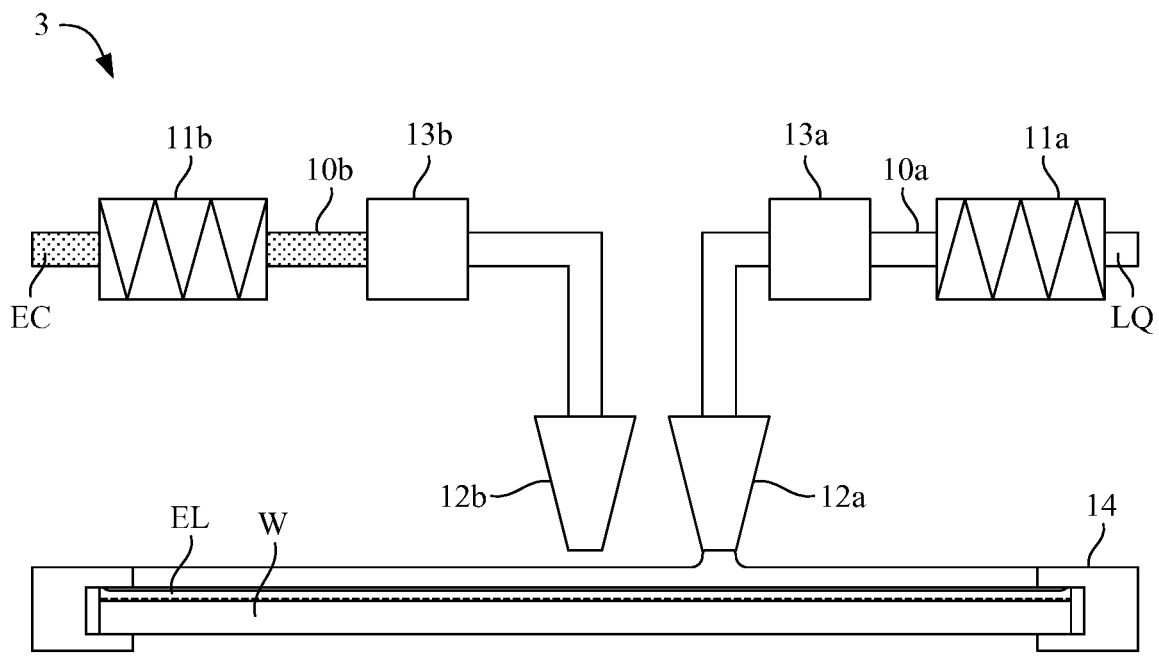
FIG. 6A is a partial view of a wafer etching apparatus according to some embodiments of the present disclosure, in which the preheated/precooled liquid is dispensed to the wafer.
Figure 6B:
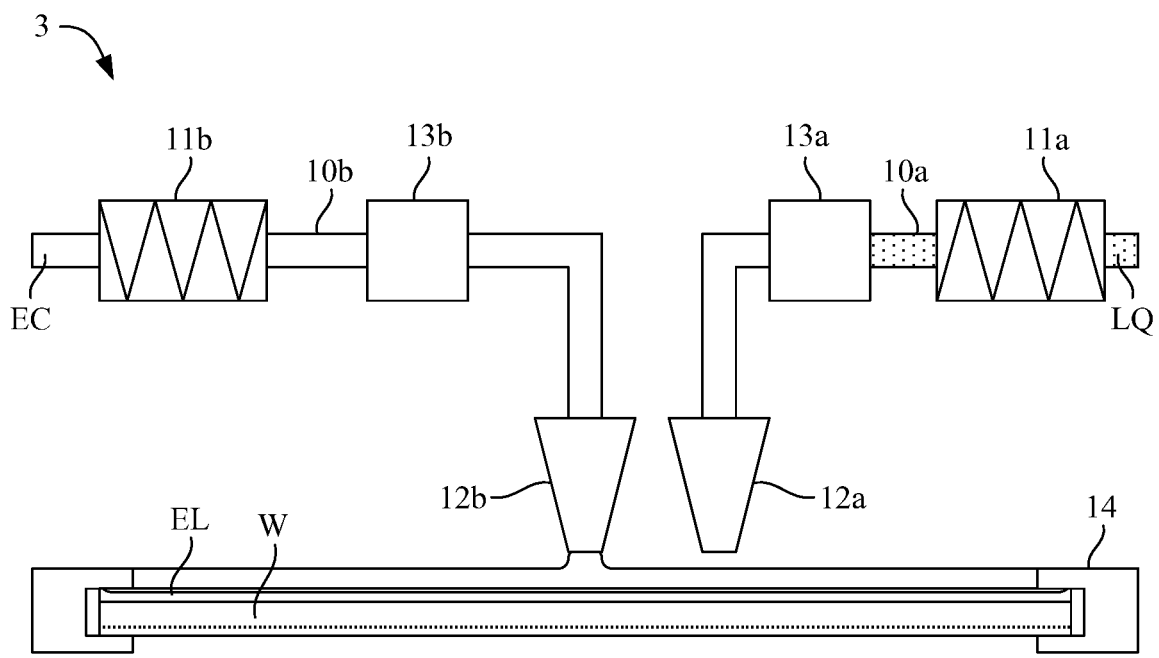
FIG. 6B is another partial view of FIG. 6A, in which the heated etchant is dispensed to the wafer.

FIG. 6A is a partial view of a wafer etching apparatus 3 according to some embodiments of the present disclosure, in which the liquid LQ is dispensed to the wafer W. FIG. 6B is another partial view of FIG. 6A, in which the heated etchant EC is dispensed to the wafer W.

As shown in FIG. 6A and FIG. 6B, the wafer etching apparatus 3 also includes the first flow channel 10a, the second flow channel 10b, the temperature-regulating module 11a, the heater 11b, the first nozzle 12a, the second nozzle 12b, the first mass flow controller 13a, the second mass flow controller 13b, and the chuck 14 without the base 15. Compared with the embodiment such as in FIG. 1 shows, the first nozzle 12a shown in FIG. 6A and FIG. 6B is configured to dispense the liquid LQ onto the front side of the wafer W.

Figure 7:
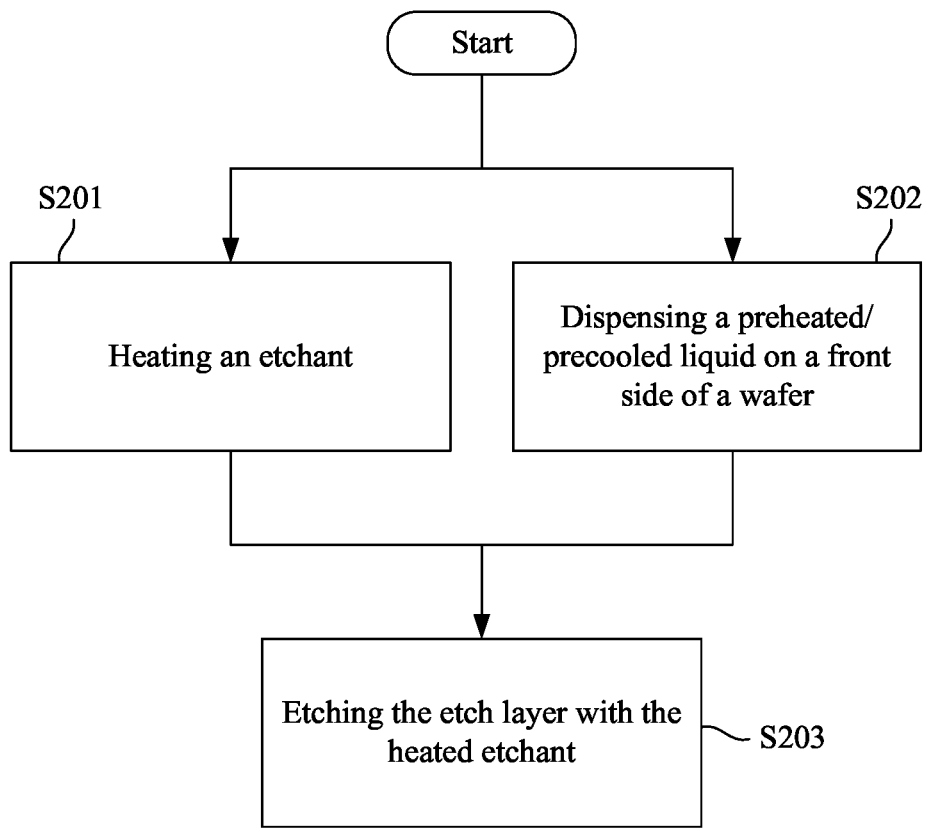
FIG. 7 is a flow chart of a method for etching an etch layer according to some embodiments of the present disclosure.

FIG. 7 is a flow chart of a method for etching an etch layer according to some embodiments of the present disclosure. As shown in FIG. 7, with reference to FIG. 6A and FIG. 6B, the method for etching an etch layer at least includes steps S201-S203 shown below, and the steps can be performed by using the wafer etching apparatus 3 shown in FIG. 6A and FIG. 6B.

In step S201, an etchant EC is heated. As shown in FIG. 6A and FIG. 6B, the etchant EC can be heated by the heater 11b in the second flow channel 10b before dispensed onto the front side of the wafer W. In some embodiments, the wafer etching apparatus 3 can further includes a temperature controller (not shown) and a temperature sensor (not shown). The temperature sensor is coupled to the second flow channel 10b and configured to sense the actual temperature of the heated etchant EC. The temperature controller is configured to adjust the actual temperature to a predetermined temperature by controlling the heater 11b. Alternatively, in some embodiments, the temperature of the etchant EC is equal to the room temperature before etching the etch layer EL of the wafer W, that is, step S201 can be omitted.

Thereafter in step S202, a preheated/precooled liquid LQ is dispensed on a front side of a wafer W. As shown in FIG. 6A, the temperature of the liquid LQ can be controlled by the temperature-regulating module 11a in the first flow channel 10a before dispensed to the front side of the wafer W, and the first mass flow controller 13a can control the flow rate of the liquid LQ dispensed out of the first nozzle 12a. Likewise, in some embodiments, the wafer etching apparatus 3 can further includes a temperature controller (not shown) and a temperature sensor (not shown). The temperature sensor is coupled to the first flow channel 10a and configured to sense the actual temperature of the liquid LQ. The temperature controller is configured to adjust the actual temperature to a predetermined temperature by controlling the temperature-regulating module 11a. In some embodiments, the chuck 14 is capable of rotating the wafer W in a plane, and the liquid LQ is dispensed at the center of the front side of the wafer W. Therefore, the dispensed liquid LQ can thus be uniformly distributed from the center to the peripheral edge of the front side of the wafer W to heat/cool the wafer W.

Thereafter in step S203, the etch layer EL is etched with the heated etchant EC. As shown in FIG. 6B, the second mass flow controller 13b can control the flow rate of the heated etchant EC dispensed out of the second nozzle 12b. In some embodiments, the chuck 14 is capable of rotating the wafer W in a plane, and the heated etchant EC is dispensed at the center of the front side of the wafer W. Therefore, the dispensed etchant EC can thus be uniformly distributed from the center to the peripheral edge of the front side of the wafer W to etch the etch layer EL.

Compared with the method shown in FIG. 2, step S203 of the method shown in FIG. 7 is performed after step S202, that is, etching the etch layer EL with the heated etchant EC is performed after dispensing the liquid LQ on the front side of the wafer W. When the liquid LQ is dispensed on the front side of the wafer W to control the temperature of the front side of the wafer W, the second mass flow controller 13b controls the heated etchant EC not to be dispensed out of the second nozzle 12b. After the temperature of the front side of the wafer W is controlled by the liquid LQ to a certain predetermined condition, the first mass flow controller 13a stops the liquid LQ from continuously dispensing, and then the second mass flow controller 13b controls the heated etchant EC to be dispensed out of the second nozzle 12b to etch the heated/cooled wafer W.

With the foregoing configuration, it can be seen that the temperature of the front side of the wafer W is controlled before dispensing the heated etchant EC. As a result, the method for etching an etch layer and the wafer etching apparatus 3 of the disclosure can well regulate and control temperature (by reducing temperature variation between the dispensed etchant EC and the heated/cooled wafer W), rapidly ramp temperature, and get better uniformity across the wafer W.

Figure 8A:
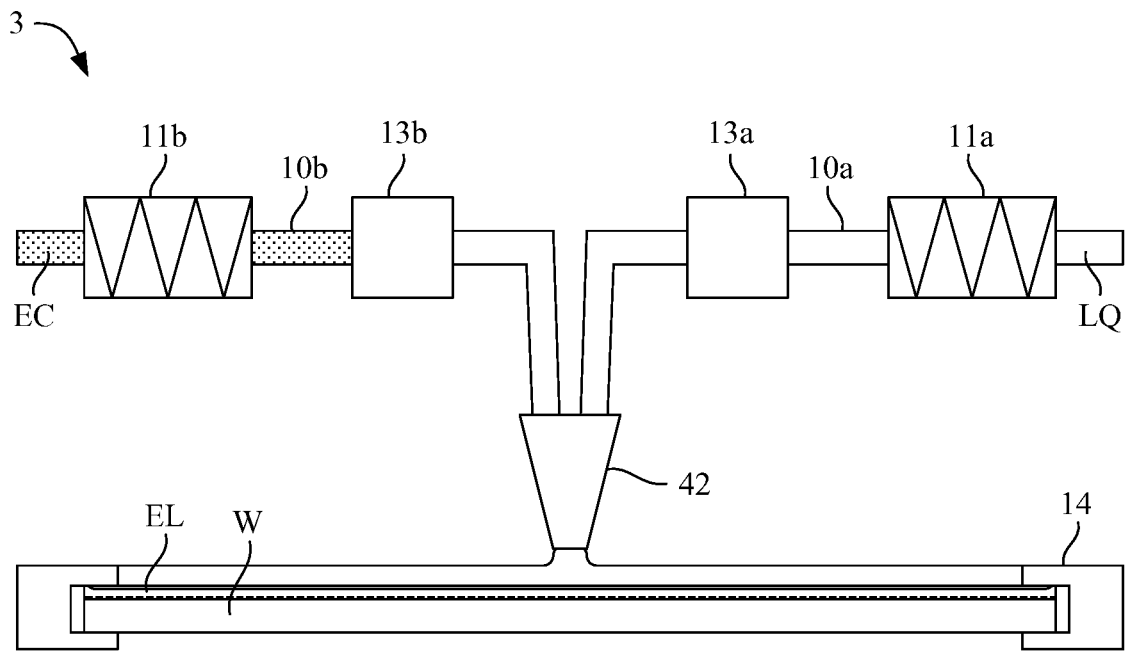
FIG. 8A is a partial view of a wafer etching apparatus according to some embodiments of the present disclosure, in which the preheated/precooled liquid is dispensed to the wafer.
Figure 8B:
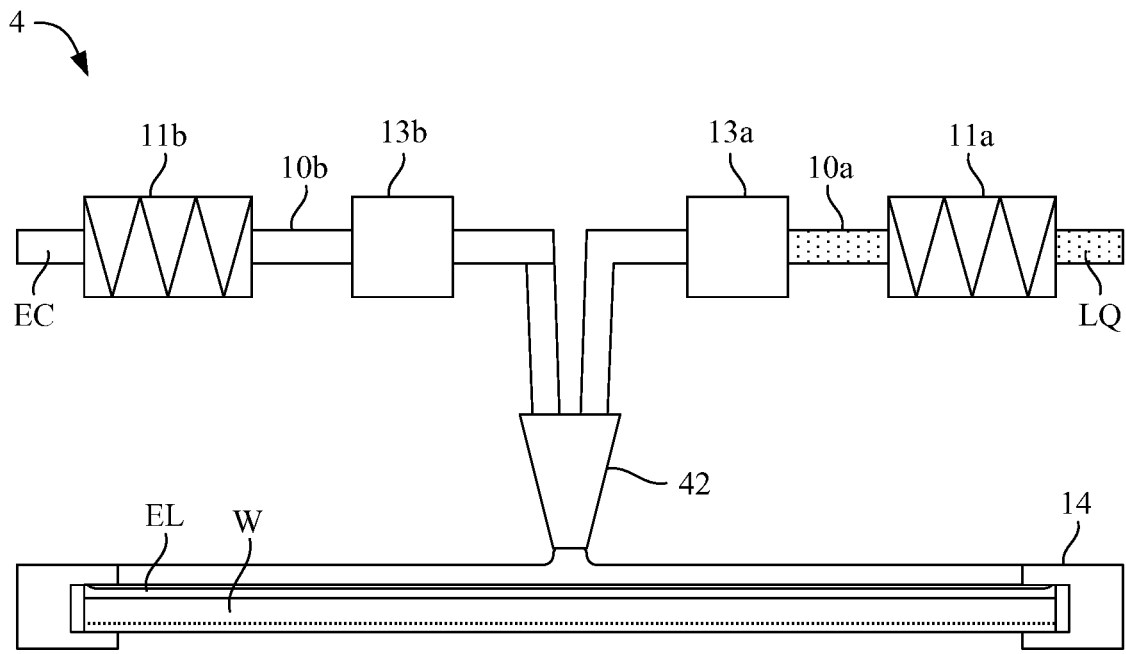
FIG. 8B is another partial view of FIG. 8A, in which the heated etchant is dispensed to the wafer.

FIG. 8A is a partial view of a wafer etching apparatus 4 according to some embodiments of the present disclosure, in which the liquid LQ is dispensed to the wafer W. FIG. 8B is another partial view of FIG. 8A, in which the heated etchant EC is dispensed to the wafer W. As shown in FIG. 8A and FIG. 8B, the wafer etching apparatus 4 also includes the first flow channel 10a, the second flow channel 10b, the temperature-regulating module 11a, the heater 11b, the first mass flow controller 13a, the second mass flow controller 13b, and the chuck 14 without the base 15. Compared with some embodiment such as FIG. 6A and FIG. 6B show, the wafer etching apparatus 4 shown in FIG. 8A and FIG. 8B includes a single nozzle 42 coupled to the first flow channel 10a and the second flow channel 10b. The nozzle 42 is configured to dispense the liquid LQ and the heated etchant EC onto the front side of the wafer W sequentially. Therefore, the method shown in FIG. 7 can also performed by the wafer etching apparatus 4 shown in FIG. 8A and FIG. 8B.

Figure 9:
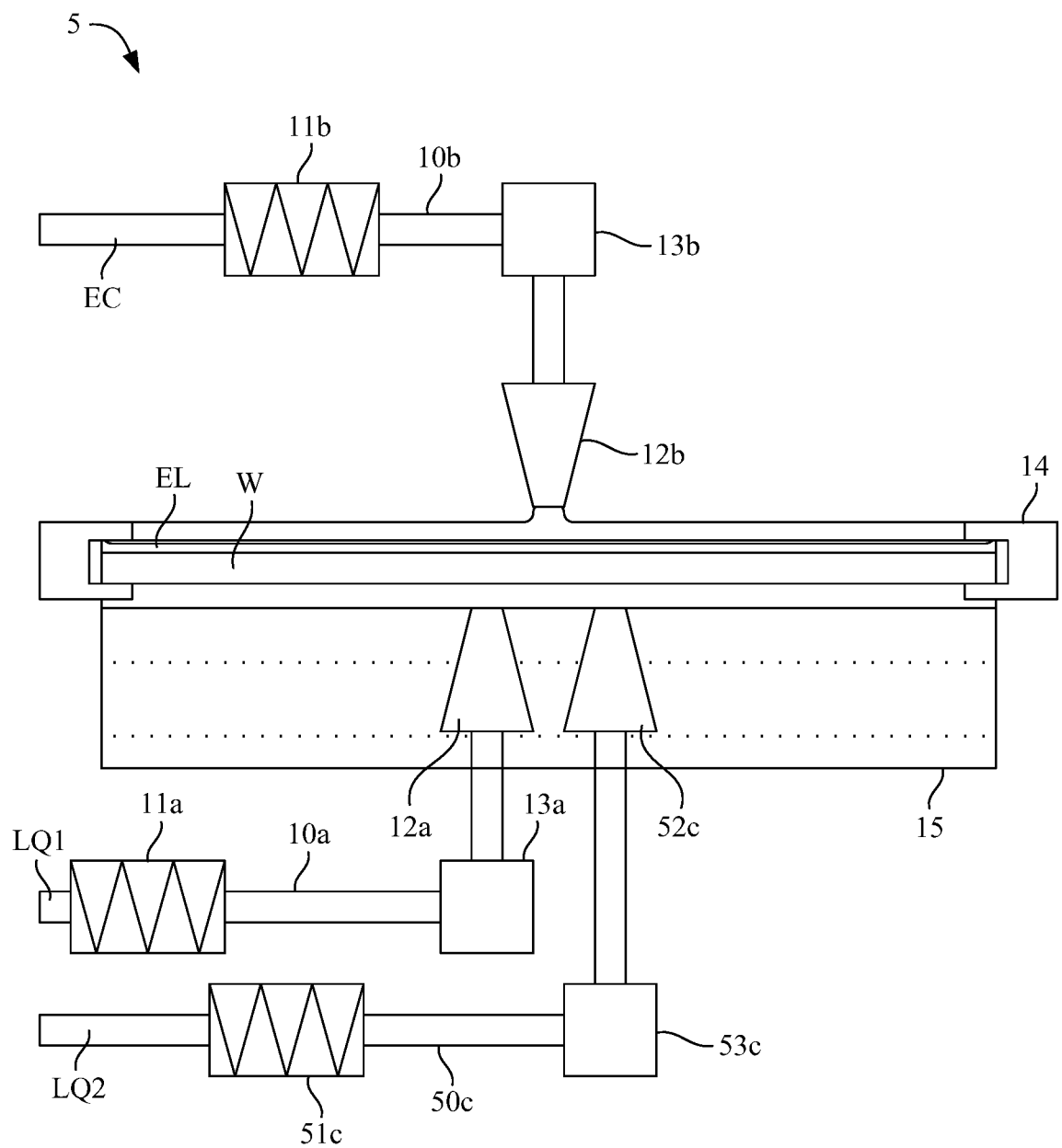
FIG. 9 is a partial view of a wafer etching apparatus according to some embodiments of the present disclosure.

FIG. 9 is a partial view of a wafer etching apparatus 5 according to some embodiments of the present disclosure.

As shown in FIG. 9, the wafer etching apparatus 5 also includes the first flow channel 10a, the second flow channel 10b, the temperature-regulating module 11a, the heater 11b, the first nozzle 12a, the second nozzle 12b, the first mass flow controller 13a, the second mass flow controller 13b, and the chuck 14 without the base 15. Compared with some embodiment such as FIG. 1 shows, the wafer etching apparatus 5 shown in FIG. 9 further includes a third flow channel 50c, a temperature-regulating module 51c, a third nozzle 52c, and a third mass flow controller 53c. The first flow channel 10a is configured to carry a first liquid LQ1 for controlling a temperature of a back side of the wafer W. The temperature-regulating module 11a is coupled to the first flow channel 10a. The temperature-regulating module 11a is configured to heat/cool the first liquid LQ1 in the first flow channel 10a. The first mass flow controller 13a is coupled to the first flow channel 10a. The first mass flow controller 13a is configured to measure and control the flow of the first liquid LQ1 at a particular range of flow rates. The first nozzle 12a is coupled to the first flow channel 10a. The first nozzle 12a is configured to dispense the first liquid LQ1 to a back side of the wafer W. The third flow channel 50c configured to carry a second liquid LQ2 for controlling the temperature of the back side of the wafer W. The temperature-regulating module 51c is coupled to the third flow channel 50c. The temperature-regulating module 51c is configured to control the temperature of the second liquid LQ2 in the third flow channel 50c. The third nozzle 52c is coupled to the third flow channel 50c. The third mass flow controller 53c is coupled to the third flow channel 50c. The third mass flow controller 53c is configured to measure and control the flow of the second liquid LQ2 at a particular range of flow rates. The third nozzle 52c is configured to dispense the second liquid LQ2 to the back side of the wafer W. The temperature-regulating module 51c in FIG. 9 is illustrated as a heater configured to heat the second liquid LQ2 for example, but the disclosure is not limited in this regard. In some embodiments, the temperature-regulating module 51c is a cooler configured to cool the second liquid LQ2.

With the foregoing configuration, the wafer W can also be preheated/precooled during or before dispensing the heated etchant EC by using the wafer etching apparatus 5 shown in FIG. 9 and the method shown in FIG. 2, so as to well regulate and control temperature (by reducing temperature variation between the dispensed etchant EC and the heated/cooled wafer W), to rapidly ramp temperature, and to get better uniformity across the wafer W.

Figure 10:
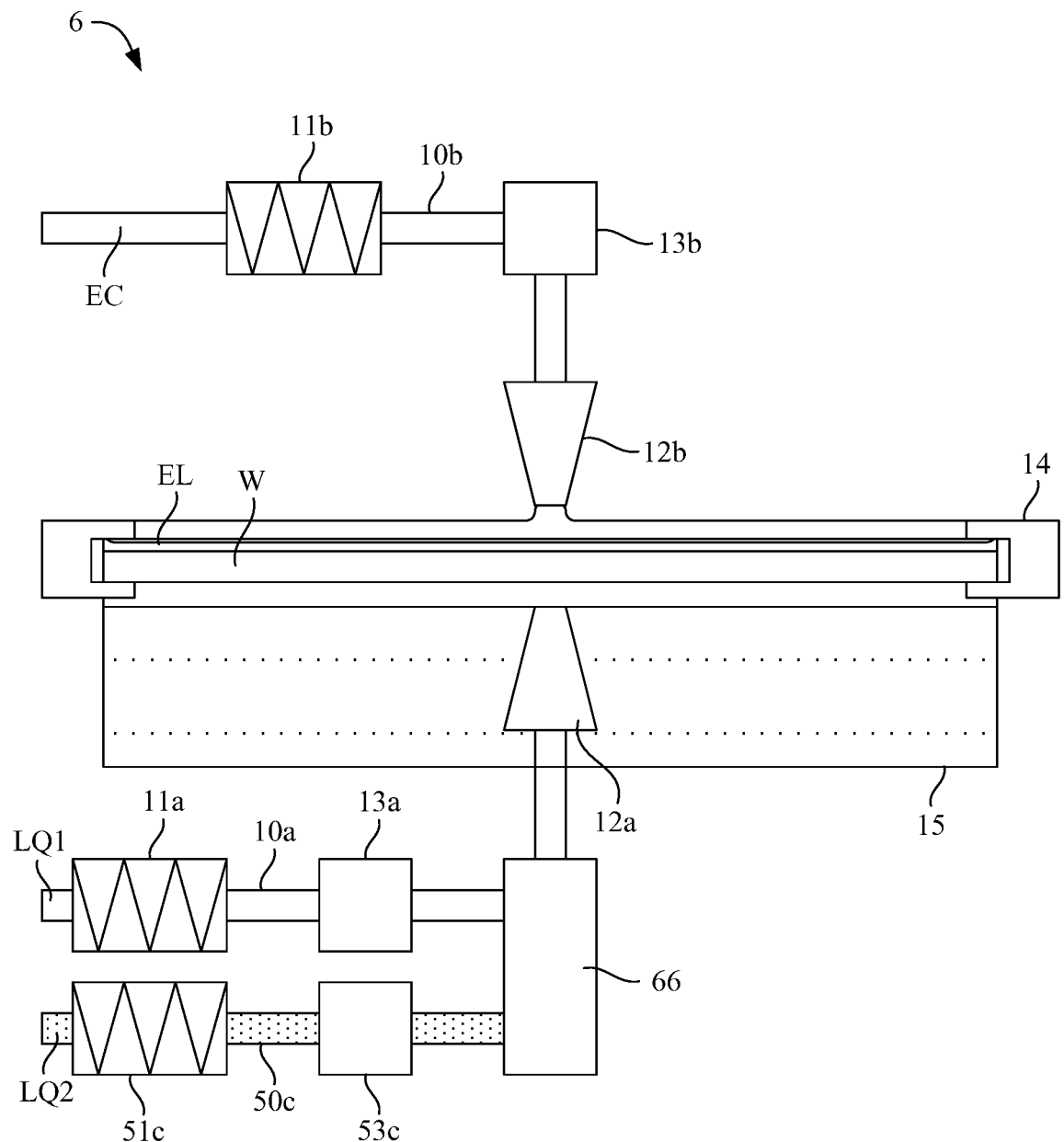
FIG. 10 is a partial view of a wafer etching apparatus according to some embodiments of the present disclosure.

FIG. 10 is a partial view of a wafer etching apparatus 6 according to some embodiments of the present disclosure.

As shown in FIG. 10, the wafer etching apparatus 6 also includes the first flow channel 10a, the second flow channel 10b, the third flow channel 50c, the temperature-regulating module 11a, the heater 11b, the temperature-regulating module 51c, the first nozzle 12a, the second nozzle 12b, the first mass flow controller 13a, the second mass flow controller 13b, the third mass flow controller 53c and the chuck 14 without the base 15. Compared with some embodiments such as FIG. 9 shows, the wafer etching apparatus 6 further includes a mixer 66 without the third nozzle 52c. The mixer 66 is coupled with the first flow channel 10a and the third flow channel 50c such that the first liquid LQ1 and the second liquid LQ2 combine to form a mixture. The first nozzle 12a is coupled to the mixer 66. The first nozzle 12a is configured to dispense the mixture to a back side of the wafer W.

With the foregoing configuration, the wafer W can also be preheated/precooled during or before dispensing the heated etchant EC by using the wafer etching apparatus 6 shown in FIG. 10 and the method shown in FIG. 2, so as to well regulate and control temperature (by reducing temperature variation between the dispensed etchant EC and the heated/cooled wafer W), to rapidly ramp temperature, and to get better uniformity across the wafer W.

Figure 11:
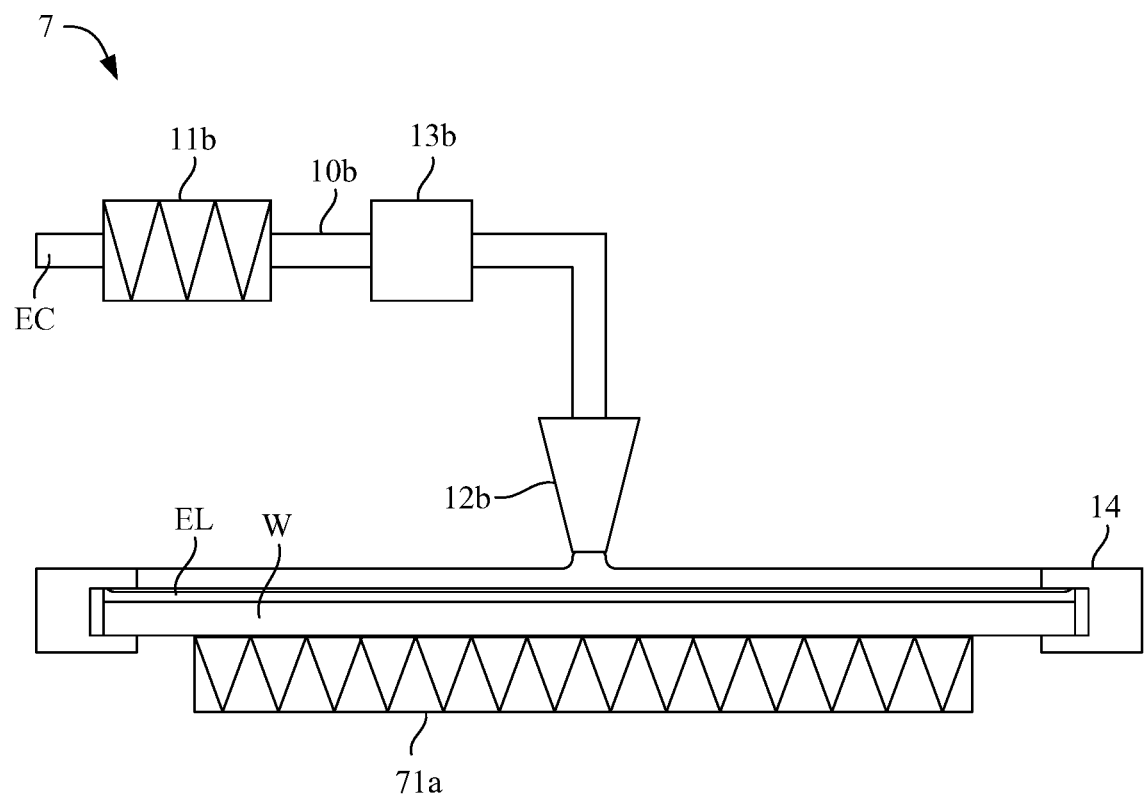
FIG. 11 is a partial view of a wafer etching apparatus according to some embodiments of the present disclosure.

FIG. 11 is a partial view of a wafer etching apparatus 7 according to some embodiments of the present disclosure.

As shown in FIG. 11, the wafer etching apparatus 7 also includes the second flow channel 10b, the heater 11b, the second nozzle 12b, the second mass flow controller 13b, and the chuck 14 without the base 15. Compared with above embodiments, the wafer etching apparatus 7 further includes a temperature-regulating module 71a thermally connected to the wafer W. In detail, the temperature-regulating module 71a is thermally connected to the back side of the wafer W, but the disclosure is not limited in this regard. The temperature-regulating module 71a is configured to control the temperature of the back side of the wafer W. In some embodiments, etching the etch layer EL with the heated etchant EC is performed during preheating/precooling the wafer W by using the temperature-regulating module 71a. In some embodiments, etching the etch layer EL with the heated etchant EC is performed after preheating/precooling the wafer W by using the temperature-regulating module 71a.

With the foregoing configuration, the wafer W can also be preheated/precooled during or before dispensing the heated etchant EC by using the wafer etching apparatus 7 shown in FIG. 11, so as to well regulate and control temperature (by reducing temperature variation between the dispensed etchant EC and the heated/cooled wafer W), to rapidly ramp temperature, and to get better uniformity across the wafer W.

According to the foregoing recitations of the embodiments of the disclosure, it can be seen that the method for etching an etch layer and the wafer etching apparatus of the disclosure is proposed to preheat/precool the wafer before dispensing the heated etchant. Furthermore, the etch profile of the wafer can be effectively controlled as needed by adjusting the temperature of the dispensed etchant and the temperature of the dispensed liquid. As a result, the disclosure can well regulate and control temperature, rapidly ramp temperature, and get better uniformity across the wafer.

According to some embodiments, a method comprises rotating a wafer, dispensing a liquid from a center of the wafer to an edge of the wafer to control a temperature of the wafer, and etching an etch layer of the wafer with an etchant during or after dispensing the liquid.

According to some embodiments, a method comprises controlling a temperature of a liquid, dispensing the liquid to a wafer to control a temperature of the wafer, after controlling the temperature of the liquid and before dispensing the liquid to the wafer, measuring and controlling a flow rate of the liquid, and etching an etch layer of the wafer with an etchant during or after dispensing the liquid.

According to some embodiments, a method comprises heating an etchant, heating or cooling a wafer to reduce a difference between a temperature of the etchant and a temperature of the wafer, and etching an etch layer of the wafer with the etchant after heating the etchant and during or after heating or cooling the wafer.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
rotating a wafer;
heating a liquid to a first temperature;
after heating the liquid to the first temperature, dispensing the liquid from a center of the wafer to a peripheral edge of the wafer;
heating an etchant to a second temperature higher than the first temperature of the liquid;
after heating the etchant to the second temperature, dispensing the etchant using a nozzle, wherein the nozzle keeps at a same position right above the center of the wafer during dispensing the etchant; and
etching an etch layer of the wafer with the etchant during or after dispensing the liquid.

2. The method of claim 1, wherein dispensing the liquid from the center of the wafer to the peripheral edge of the wafer comprises:
dispensing the liquid by a nozzle; and
moving the nozzle from the center of the wafer to the peripheral edge of the wafer.

3. The method of claim 2, wherein dispensing the liquid is such that the nozzle is directed to a back side of the wafer.

4. The method of claim 2, wherein the step of heating the etchant is performed by a temperature-regulating module, and the method further comprising
moving the temperature-regulating module along with the nozzle.

5. The method of claim 2, further comprising:
controlling a flow rate of the liquid by a mass flow controller; and
moving the mass flow controller along with the nozzle.

6. The method of claim 1, wherein a difference between a temperature of the etchant at a center of a front side of the wafer and a temperature of the liquid at the center of a back side of the wafer is less than a difference between a temperature of the etchant at a peripheral edge of the front side of the wafer and a temperature of the liquid at the peripheral edge of the back side of the wafer.

7. The method of claim 1, wherein the wafer has an initial temperature different from the first and second temperatures before dispensing the liquid and before dispensing the etchant, and a difference between the first temperature of the liquid and the second temperature of the etchant is less than a difference between the first temperature of the liquid and the initial temperature of the wafer.

8. A method comprising:
heating an etchant to a first predetermined temperature;
heating or cooling a liquid to a second predetermined temperature;
after heating or cooling the liquid, dispensing the liquid over a wafer; and
etching an etch layer of the wafer with the etchant after heating the etchant and after dispensing the liquid over the wafer, wherein the wafer has an initial temperature different from the first and second predetermined temperatures before dispensing the liquid and before etching an etch layer of the wafer with the etchant, and a difference between the first predetermined temperature of the etchant and the second predetermined temperature of the liquid is less than a difference between the second predetermined temperature of the liquid and the initial temperature of the wafer.

9. The method of claim 8, further comprising;
continuously dispensing the etchant from a position right above a front side of the wafer.

10. The method of claim 8, wherein heating or cooling the liquid is performed by a temperature-regulating module.

11. The method of claim 8, wherein the step of dispensing the liquid comprises dispensing the liquid to a gap between the wafer and a base under the wafer.

12. The method of claim 8, wherein the step of dispensing the liquid comprises dispensing the liquid to a back side of the wafer from a nozzle.

13. The method of claim 12, further comprising:
moving the nozzle from a center of the wafer toward a peripheral edge of the wafer when dispensing the liquid to the back side of the wafer.

14. The method of claim 8, further comprising:
rotating the wafer during heating or cooling the wafer.

15. A method comprising:
holding, by a chuck, a wafer covered by an etch layer, wherein the chuck and the wafer are disposed over a base;
dispensing, by using a first nozzle embedded in the base, a liquid into a gap formed between the wafer and the base, wherein a temperature of the liquid is different from an initial temperature of the wafer when the liquid is dispensed to the gap; and
during or after dispensing the liquid, dispensing, by using a second nozzle over the chuck, an etchant to the etch layer covering the wafer, such that a difference between a temperature of the etchant at a center of a front side of the wafer and a temperature of the liquid at the center of a back side of the wafer is greater than a difference between a temperature of the etchant at a peripheral edge of the front side of the wafer and a temperature of the liquid at the peripheral edge of the back side of the wafer, wherein the second nozzle remains at a position right above the center of the front side of the wafer during the dispensing of the etchant.

16. The method of claim 15, further comprising:
heating or cooling the liquid prior to dispensing the liquid into the gap.

17. The method of claim 15, further comprising:
moving the first nozzle from the center of the back side of the wafer toward the peripheral edge of the back side of the wafer when dispensing the liquid into the gap.

18. The method of claim 15, further comprising:
heating the etchant prior to dispensing the etchant to the etch layer.

19. The method of claim 15, wherein the first nozzle is at a location between the center and the peripheral edge of the back side of the wafer.

20. The method of claim 15, wherein the temperature of the etchant at the center of the front side of the wafer is greater than the temperature of the liquid at the center of the back side of the wafer.

* * * * *